(12) United States Patent
Yazawa et al.

(10) Patent No.: US 8,418,557 B2
(45) Date of Patent: Apr. 16, 2013

(54) PHYSICAL QUANTITY SENSOR

(75) Inventors: Hisayuki Yazawa, Niigata-ken (JP); Kiyoshi Sato, Niigata-ken (JP); Katsuya Kikuiri, Niigata-ken (JP); Toru Takahashi, Niigata-ken (JP); Hisanobu Ohkawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 251 days.

(21) Appl. No.: 12/841,748

(22) Filed: Jul. 22, 2010

(65) Prior Publication Data

US 2010/0281980 A1 Nov. 11, 2010

Related U.S. Application Data

(63) Continuation of application No. PCT/JP2009/051935, filed on Feb. 5, 2009.

(30) Foreign Application Priority Data

Feb. 7, 2008 (JP) ................................ 2008-027819
Jul. 4, 2008 (JP) ................................ 2008-176153

(51) Int. Cl.
*G01P 15/125* (2006.01)

(52) U.S. Cl.
USPC ........................................... 73/514.32

(58) Field of Classification Search ............... 73/514.32
See application file for complete search history.

(56) References Cited

U.S. PATENT DOCUMENTS

| 2002/0158293 | A1 | 10/2002 | Lee et al. |
| 2004/0187578 | A1 | 9/2004 | Malametz et al. |
| 2006/0213268 | A1 | 9/2006 | Asami et al. |

FOREIGN PATENT DOCUMENTS

| DE | 10111212 A1 | | 9/2001 |
| JP | 11-304834 | | 11/1999 |
| JP | 2001-194153 A | | 7/2001 |
| JP | 2001194153 | | 7/2001 |
| JP | 2001194153 A | * | 7/2001 |
| JP | 2003-14778 A | | 1/2003 |
| JP | 2006-266873 A | | 10/2006 |

OTHER PUBLICATIONS

International Search Report issued in corresponding PCT Application No. PCT/JP2009/051935; mailed May 19, 2009.
Extended European Search Report issued in corresponding European Patent Application No. 09707536.0, mailed Oct. 28, 2011.

* cited by examiner

*Primary Examiner* — Hezron E Williams
*Assistant Examiner* — Gregory J Redmann
(74) *Attorney, Agent, or Firm* — Brinks Hofer Gilson & Lione

(57) ABSTRACT

A physical quantity sensor includes a support substrate, anchor portions fixed to a top surface of the support substrate, a movable portion positioned above the support substrate and supported by the anchor portions with support portions provided therebetween such that the movable portion is movable in a height direction, and detection portions for detecting a displacement of the movable portion. The support portions include beam portions provided between the movable portion and the anchor portions such that spring portions are provided between the beam portions and each of the movable portion and the anchor portions, the beam portions having a rigidity higher than a rigidity of the spring portions. The movable portion translates in the height direction owing to twisting of the spring portions and displacements in the height direction of distal ends of the beam portions, the movable portion being supported at the distal end.

7 Claims, 12 Drawing Sheets

PHYSICAL QUANTITY SENSOR

RELATED APPLICATIONS

This application is a Continuation of International Application No. PCT/JP2009/051935 filed on Feb. 5, 2009, which claims benefit of Japanese Patent Application No. 2008-027819 filed on Feb. 7, 2008 and No. 2008-176153 filed on Jul. 4, 2008). The entire contents of each application noted above are hereby incorporated by reference.

BACKGROUND OF THE INVENTION

1. Field of the Invention

The present invention relates to a physical quantity sensor, such as an acceleration sensor, manufactured using a microelectro-mechanical system (MEMS) technique.

2. Description of the Related Art

An acceleration sensor formed using a silicon-on-insulator (SOI) substrate includes a movable potion that moves when an acceleration is applied thereto and a detection portion for measuring the displacement of the movable portion. The movable portion and the detection portion are provided on an SOI layer (active layer) positioned above a support substrate.

According to, for example, a known structure for detecting an acceleration applied in a height direction (Z direction), a movable portion is moved in a see-saw manner when an acceleration is applied in the height direction. In the see-saw type structure, the movable portion is supported at a position shifted from the center of gravity of the movable portion. FIGS. 25A and 25B are schematic diagrams illustrating the structure. FIG. 25A is a perspective view of the structure and FIG. 25B is a side view of the structure viewed in the direction shown by the arrow XXVB.

A movable portion 201 includes a first movable portion 203 that extends a long distance in an X1 direction from a support position 202 and a second movable portion 204 that extends a short distance in an X2 direction from the support position 202. When an acceleration is applied in the height direction (Z direction) and the first movable portion 203 tilts downward, the second movable portion 204 tilts upward. Z-axis differential output detection portions 206 and 207, for example, are provided on a support substrate 205 so as to face the first movable portion 203 and the second movable portion 204, respectively.

Japanese Unexamined Patent Application Publication No. 2006-266873 is an example of related art.

However, the Z-axis compatible acceleration sensor illustrated in FIGS. 25A and 25B has the following problems.

That is, to cause the movable portion 201 to adequately tilt in the height direction when an acceleration is applied in the height direction and to increase the displacement of the movable portion 201 in the height direction, the difference between the areas of the first and second movable portions 203 and 204 must be increased. Therefore, it is difficult to reduce the size of the movable portion 201. In addition, to improve the sensor sensitivity, it is necessary to place the Z-axis differential output detection portions 206 and 207 at positions spaced from the support position in the tilting direction, where the first and second movable portions 203 and 204 are moved by large distances.

Therefore, it has been difficult to provide a Z-axis compatible acceleration sensor that is small and that has a high sensitivity.

SUMMARY OF THE INVENTION

To solve the above-described problems, the present invention provides, in particular, a Z-axis compatible physical quantity sensor that is small and has high sensitivity.

A physical quantity sensor according to the present invention includes a support substrate, an anchor portion fixed to a top surface of the support substrate, a movable portion positioned above the support substrate and supported by the anchor portion with a plurality of support portions provided therebetween such that the movable portion is movable in a height direction, and a detection portion for detecting a displacement of the movable portion.

Each support portion includes a beam portion provided between the movable portion and the anchor portion such that a spring portion is provided between the beam portion and each of the movable portion and the anchor portion, the beam portion having a rigidity higher than a rigidity of the spring portion, and the movable portion translates in the height direction owing to twisting of the spring portion and a displacement in the height direction of a distal end of the beam portion, the movable portion being supported at the distal end.

The support portions are provided so as to extend from the anchor portion, and the beam portions of the respective support portions are connected to each other with a connection spring at proximal ends of the beam portions opposite to the distal ends, the connection spring having a high flexural rigidity in the height direction. In such a case, each beam portion can be moved in a normal vibration mode. Accordingly, a Z-axis compatible physical quantity sensor that is small and has high sensitivity is provided. In addition, each beam portion can be moved in a normal vibration mode.

According to the present invention, preferably, the movable portion is supported by a plurality of the support portions at point symmetrical positions about the center of the movable portion. In such a case, the translation of the movable portion in the height direction can be stabilized.

More preferably, the movable portion is supported by the support portions at two or more different pairs of point symmetrical positions.

According to the present invention, the anchor portion may be positioned inside an area defined by the outermost periphery of the movable portion, and the beam portion may be positioned outside the outermost periphery of the movable portion, the beam portion being connected to the anchor portion with the spring portion provided between the beam portion and the anchor portion. In such a case, a physical quantity sensor that is small and has high sensitivity can be more effectively provided.

According to the present invention, more preferably, one pair of the anchor portions are provided at point symmetrical positions about the center of the movable portion, and two of the support portions are provided for each anchor portion and extend in the opposite directions at positions outside the outermost periphery of the movable portion, the movable portion being supported by the support portions at two different pairs of point symmetrical positions. In such a case, the translation of the movable portion in the height direction can be further stabilized, and the displacement of the movable portion can be increased.

According to the present invention, the area defined by the outermost periphery of the movable portion may be substantially rectangular, and the beam portion may be arranged along the outermost periphery. In such a case, the size of the apparatus can be more effectively reduced.

In addition, according to the present invention, preferably, the beam portion is provided with an extending portion at the distal end of the beam portion, the extending portion extending from a position where the movable portion is supported by the spring portion and being capable of coming into contact with the top surface of the support substrate before the movable portion does when the movable portion is moved downward. In such a case, sticking can be reliably prevented.

According to the present invention, a Z-axis compatible physical quantity sensor that is small and has a high sensitivity can be provided.

DESCRIPTION OF THE PREFERRED EMBODIMENTS

Figure 1A:
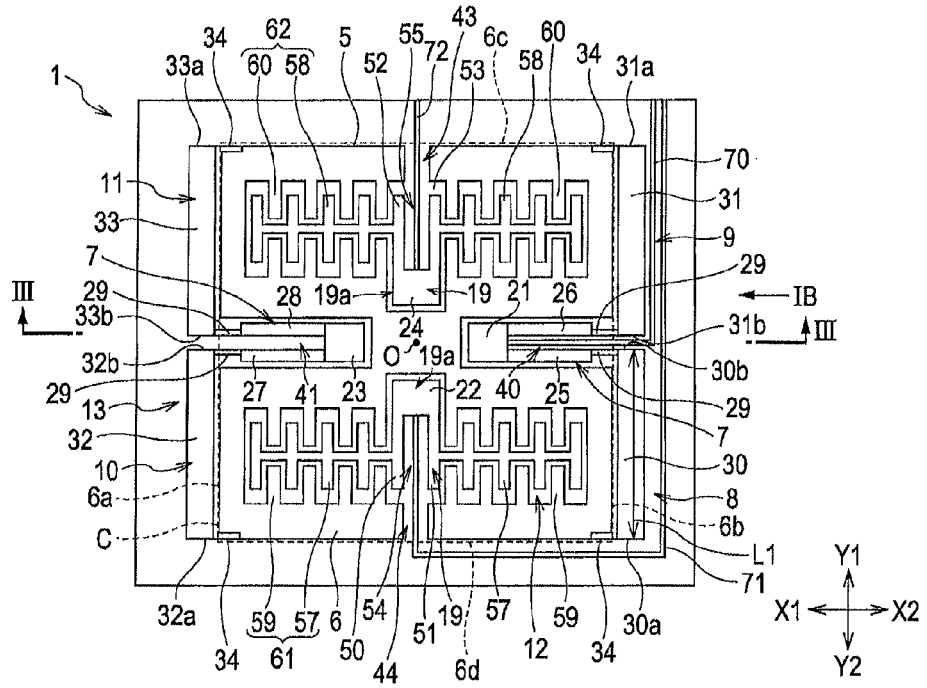
FIG. 1A is a plan view of an acceleration sensor according to an embodiment.
Figure 1B:
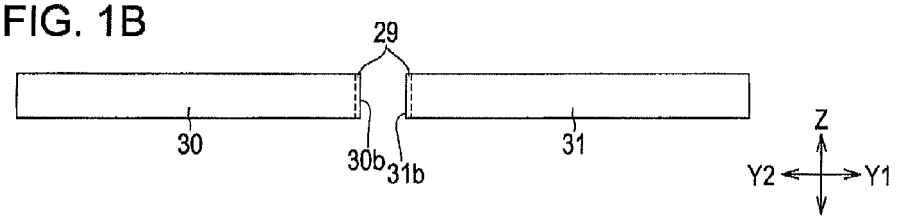
FIG. 1B is a side view of beam portions viewed in the direction shown by the arrow IB.
Figure 1C:
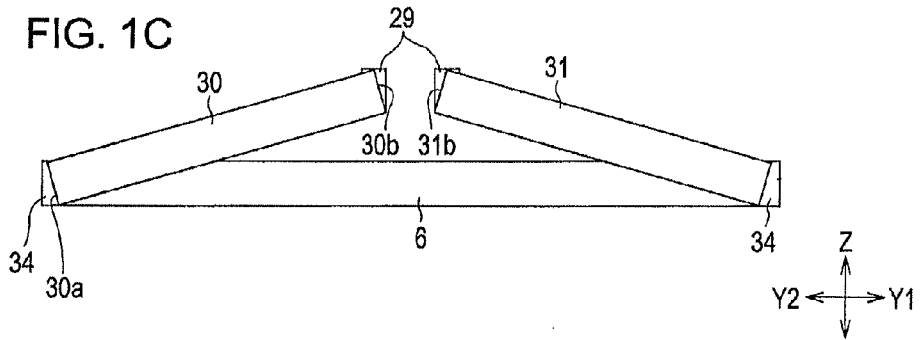
FIG. 1C is a side view of the beam portions and a movable portion moved in response to an acceleration applied in a height direction.
Figure 2:
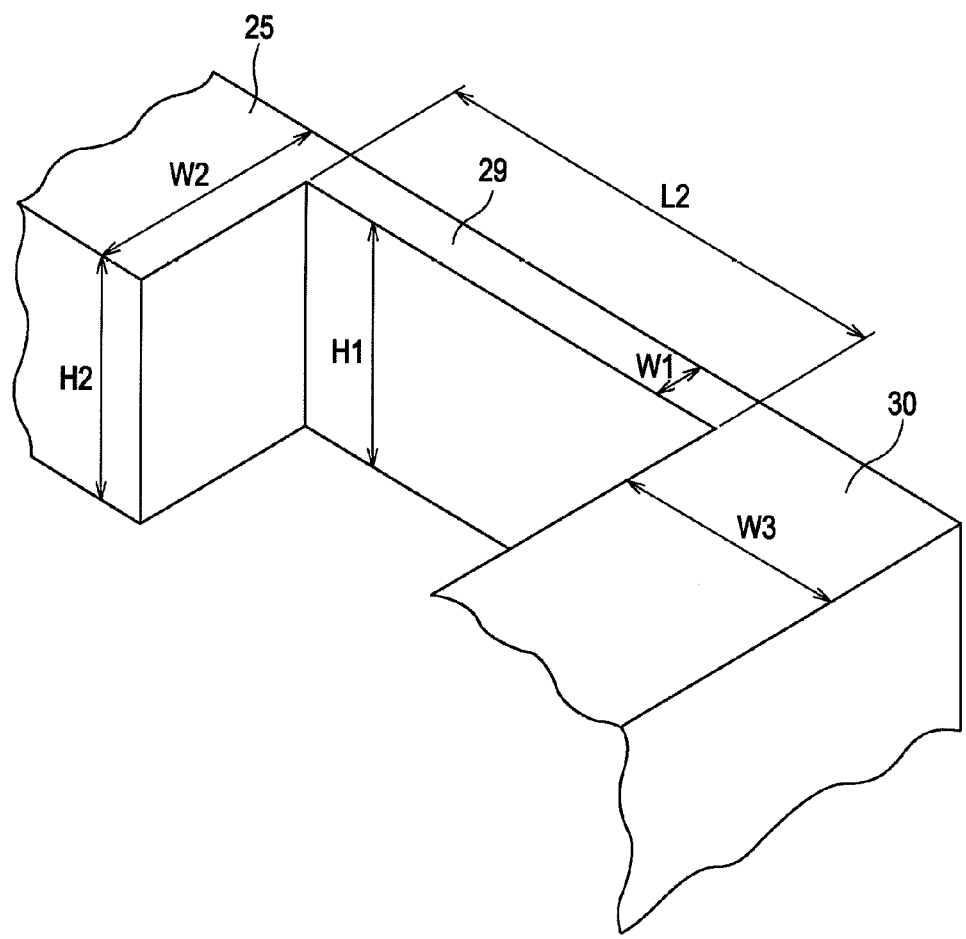
FIG. 2 is an enlarged perspective view illustrating a spring portion, a part of a beam portion, and a part of an arm portion.
Figure 3:
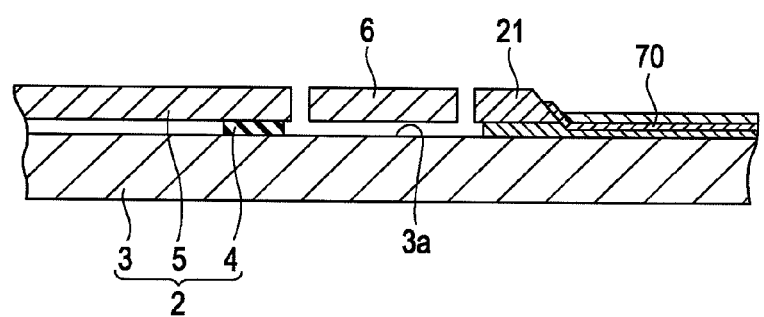
FIG. 3 is a partial sectional view of FIG. 1A taken along line in the height direction viewed in the direction shown by the arrows.

FIG. 1A is a plan view of an acceleration sensor according to the present embodiment. FIG. 1B is a side view of beam portions viewed in the direction shown by the arrow IB. FIG. 1C is a side view of the beam portions and a movable portion moved in response to an acceleration applied in a height direction. FIG. 2 is an enlarged perspective view illustrating a spring portion, a part of a beam portion, and a part of an arm portion. FIG. 3 is a partial sectional view of FIG. 1A taken along line in the height direction viewed in the direction shown by the arrows.

As illustrated in FIG. 3, the acceleration sensor 1 is formed using a silicon-on-insulator (SOI) substrate 2. The SOI substrate 2 includes a support substrate 3 formed of a silicon substrate, an SOI layer (active layer) 5 formed of a silicon substrate, and an oxide insulating layer 4 formed of, for example, SiO2 and positioned between the support substrate 3 and the SOI layer 5.

As illustrated in FIG. 1A, an element section 13 is formed in the SOI layer 5. The element section 13 includes a movable portion (weight) 6, detection portions 61 and 62 for detecting a displacement of the movable portion 6, and support portions 8 to 11. The movable portion 6 is supported by first and second anchor portions 21 and 23 with the support portions 8 to 11 provided between the movable portion 6 and the anchor portions 21 and 23. The oxide insulating layer 4 illustrated in FIG. 3 is not provided under the movable portion 6 or the detection portions 61 and 62, and the movable portion 6 and the detection portions 61 and 62 are positioned above the support substrate 3. In contrast, the first and second anchor portions 21 to 23 and third and fourth anchor portions 22 and 24 are fixed to and supported by the support substrate 3 with the oxide insulating layer 4 provided thereunder.

In the structure illustrated in FIG. 1A, an area C (shown by the dashed lines in FIG. 1A) defined by the outermost periphery of the movable portion 6 has a rectangular shape. Recessed portions 7 are formed in outermost sides 6a and 6b of the movable portion 6 in the left-right directions (X1 and X2 directions) at the centers thereof. The recessed portions 7 are recessed toward the center O of the movable portion 6.

The first anchor portion 21 and the second anchor portion 23 are provided in the recessed portions 7 at positions near the center O of the movable portion 6.

Two arm portions 25 and 26 extend from the first anchor portion 21 in the X2 direction. Two arm portions 27 and 28 extend from the second anchor portion 23 in the X1 direction. As illustrated in FIG. 1A, a slit 40 is provided between the arm portions 25 and 26 that extend from the first anchor portion 21. The slit 40 has a predetermined dimension in the Y1-Y2 directions. Similarly, a slit 41 is provided between the arm portions 27 and 28 that extend from the second anchor portion 23. The slit 41 has a predetermined dimension in the Y1-Y2 directions.

The arm portions 25 to 28 may either be supported on the support substrate 3 with the oxide insulating layer 4 interposed therebetween, or be positioned above the support substrate 3 without the oxide insulating layer 4 interposed therebetween. Preferably, the arm portions 25 to 28 are positioned above the support substrate 3. In such a case, when the support substrate 3 is deformed, the influence of the deformation is small.

As illustrated in FIGS. 1A and 2, an anchor-side spring portion 29 is provided so as to linearly extend continuously from each of the arm portions 25 to 28 at an end opposite to the anchor portion 21 or 23. The width W1 of each anchor-side spring portion 29 is smaller than the width W2 of the arm portions 25 to 28. The rigidity of the arm portions 25 to 28 is higher than that of the anchor-side spring portions 29.

As illustrated in FIG. 2, each anchor-side spring portion 29 is shaped such that the height (thickness) H1 thereof is larger than the width W1 thereof. In this embodiment, the height H1 of each anchor-side spring portion 29 is equal to the height H2 of the arm portions 25 to 28. In addition, the length L2 of each anchor-side spring portion 29 is larger than the width W1 thereof. The width W1 of each anchor-side spring portion 29 is about 0.8 $\mu$m to 2.0 $\mu$m, the length L2 thereof is about 50 $\mu$m to 100 $\mu$m, and the height H1 thereof is about 10 $\mu$m to 30 $\mu$m.

As illustrated in FIG. 1A, the arm portion 25 provided on the first anchor portion 21 is connected to a first beam portion 30 with the corresponding anchor-side spring portion 29 provided therebetween. The first beam portion 30 extends in the Y2 direction at a position outside the outer side 6b of the movable portion 6. In addition, as illustrated in FIG. 1A, the arm portion 26 provided on the first anchor portion 21 is connected to a second beam portion 31 with the corresponding anchor-side spring portion 29 provided therebetween. The second beam portion 31 extends in the Y1 direction at a position outside the outer side 6b of the movable portion 6. In addition, as illustrated in FIG. 1A, the arm portion 27 provided on the second anchor portion 23 is connected to a third beam portion 32 with the corresponding anchor-side spring portion 29 provided therebetween. The third beam portion 32 extends in the Y2 direction at a position outside the outer side 6a of the movable portion 6. In addition, as illustrated in FIG. 1A, the arm portion 28 provided on the second anchor portion 23 is connected to a fourth beam portion 33 with the corresponding anchor-side spring portion 29 provided therebetween. The fourth beam portion 33 extends in the Y1 direction at a position outside the outer side 6a of the movable portion 6. As illustrated in FIG. 1A, proximal ends 30b to 33b of the beam portions 30 to 33, respectively, are connected to the corresponding anchor-side spring portions 29.

As illustrated in FIGS. 1A and 2, the width W3 of each of the beam portions 30 to 33 is larger than the width W1 of each anchor-side spring portion 29. Therefore, the rigidity of the beam portions 30 to 33 is higher than that of the anchor-side spring portions 29.

The height (thickness) of each of the beam portions 30 to 33 is substantially equal to the height H1 of each anchor-side spring portion 29 and the height H2 of each arm portion. The beam portions 30 to 33 are positioned above the support substrate 3. In the present embodiment, as illustrated in FIG. 1A, the length L1 of each of the beam portions 30 to 33 is set such that distal ends 30a to 33a of the beam portions 30 to 33, respectively, are opposed to the corners of the movable portion 6 in the X1-X2 directions. The distal ends 30a to 33a of the respective beam portions 30 to 33 are connected to the movable portion 6 at positions near the four corners of the movable portion 6 with movable-portion-side spring portions 34, which linearly extend, provided therebetween. The width and the height (thickness) of each movable-portion-side spring portion 34 are substantially equal to the width W1 and the height H1, respectively, of each anchor-side spring portion 29. The width W3 of each of the beam portions 30 to 33 is about 10 $\mu$m to 30 $\mu$m, the length L1 thereof is about 300 $\mu$m to 600 $\mu$m, and the height thereof is about 10 $\mu$m to 30 $\mu$m.

Thus, the movable portion 6 is connected to the first and second anchor portions 21 and 23 by support portions 8 to 11 which include the arm portions 25 to 28, the anchor-side spring portions 29, the beam portions 30 to 33, and the movable-portion-side spring portions 34.

The anchor-side spring portions 29 and the movable-portion-side spring portions 34 are not easily bent in the height direction (thickness direction). Therefore, in an initial state in which no acceleration is applied in the height direction (Z direction), the beam portions 30 to 33 are parallel to the Y1-Y2 directions and are not moved in the height direction, as illustrated in FIG. 1B.

When, for example, a downward force (inertial force) caused by an acceleration is applied to the movable portion 6 that is in the initial state illustrated in FIG. 1B, the movable-portion-side spring portions 34 and the anchor-side spring portions 29 are twisted. Accordingly, as illustrated in FIG. 1C, the distal ends 30a to 33a of the respective beam portions 30 to 33 are pivoted downward by the same amount about the proximal ends 30b to 33b of the respective beam portions 30 to 33. Thus, the distal ends 30a to 33a of the beam portions 30 to 33 are positioned below the proximal ends 30b to 33b. Since the beam portions 30 to 33 have a high rigidity, the beam portions 30 to 33 themselves are barely bent or twisted. Therefore, the beam portions 30 to 33 simply move in the height direction without changing the rectangular parallelepiped shape thereof when the spring portions 29 and 34 are twisted. Accordingly, owing to the twisting of the spring portions 29 and 34 and the movement of the distal ends 30a to 33a of the respective beam portions 30 to 33 in the height direction, the movable portion 6 moves downward (translates in the height direction) while maintaining the state in which the movable portion 6 is parallel to a top surface 3a (see FIG. 3) of the support substrate 3.

As illustrated in FIG. 1A, slits 43 and 44 having a predetermined dimension are formed in the movable portion 6 so as to extend from the centers of the outermost sides 6c and 6d of the movable portion 6 in the Y1-Y2 directions toward the center O of the movable portion 6. Spaces 19 that are large enough to accommodate fixed electrodes 57 and 58 included in the detection portions 61 and 62, respectively, are formed in the movable portion 6 in an area inside the slits 43 and 44.

As illustrated in FIG. 1A, recessed portions 19a that are recessed toward the center O of the movable portion 6 are formed in the spaces 19, and the third anchor portion 22 and the fourth anchor portion 24 are disposed in the recessed portions 19a. Two arm portions 50 and 51 (which serve also as fixed electrodes) extend from the third anchor portion 22 in the Y2 direction. Two arm portions 52 and 53 (which serve also as fixed electrodes) extend from the fourth anchor portion 24 in the Y1 direction. Slits 54 and 55 having a predetermined dimension in the X1-X2 directions are respectively formed between the arm portions 50 and 51 and between the arm portions 52 and 53. The slits 54 and 55 that are respectively formed between the arm portions 50 and 51 and between the arm portions 52 and 53 are spatially connected to the slits 43 and 44 formed in the movable portion 6, and are open to the outside of the movable portion 6.

As illustrated in FIG. 1A, the first fixed electrodes 57 are formed in comb-shaped structures that extend in the X1 and X2 directions from the two arm portions 50 and 51, respectively, which extend from the third anchor portion 22 in one of the spaces 19 in the movable portion 6. The first fixed electrodes 57 are arranged with predetermined intervals therebetween in the X1-X2 directions. In addition, as illustrated in FIG. 1A, the second fixed electrodes 58 are formed in comb-shaped structures that extend in the X1 and X2 directions from the two arm portions 52 and 53, respectively, which extend from the fourth anchor portion 24 in the other one of the spaces 19 in the movable portion 6. The second fixed electrodes 58 are arranged with predetermined intervals therebetween in the X1-X2 directions.

As illustrated in FIG. 1A, first movable electrodes 59 that are arranged alternately with the first fixed electrodes 57 with intervals therebetween are formed integrally with the movable portion 6 in one of the spaces 19. In addition, as illustrated in FIG. 1A, second movable electrodes 60 that are arranged alternately with the second fixed electrodes 58 with intervals therebetween are formed integrally with the movable portion 6 in the other one of the spaces 19.

The first fixed electrodes 57 and the first movable electrodes 59 illustrated in FIG. 1A form the first detection portion 61, and the second fixed electrodes 58 and the second movable electrodes 60 illustrated in FIG. 1A form the second detection portion 62.

The structure and detection principle of the first and second detection portions 61 and 62 will now be described.

Figure 12A:
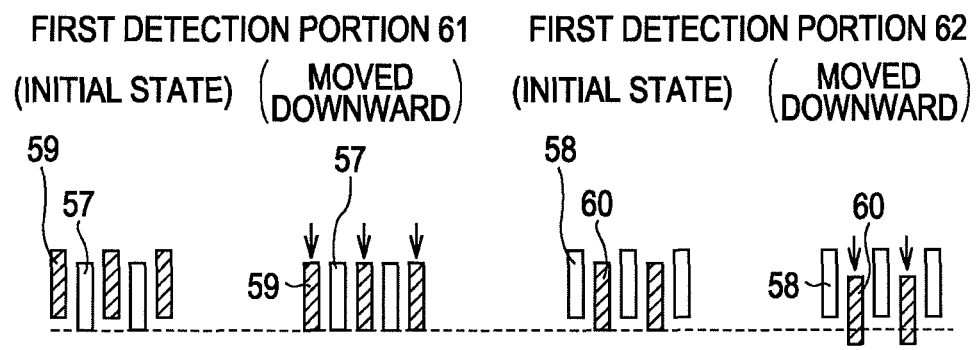
FIG. 12A is a vertical sectional view of movable and fixed electrodes formed in comb-like structures, which illustrates the initial state and a state in which the movable portion is moved downward from the initial state.
Figure 12B:
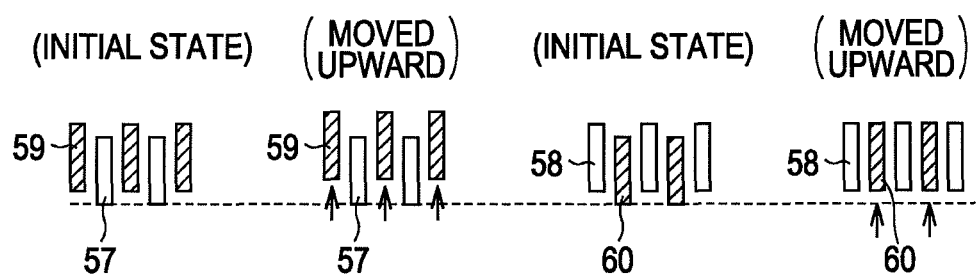
FIG. 12B is a vertical sectional view of the movable and fixed electrodes formed in the comb-like structures, which illustrates the initial state and a state in which the movable portion is moved upward from the initial state.

FIGS. 12A and 12B illustrate sectional views of the movable electrodes 59 and 60 and the fixed electrodes 57 and 58 taken along the thickness direction. Only the movable electrodes 59 and 60 are shown by the shaded sections in FIGS. 12A and 12B so that the movable electrodes and the fixed electrodes can be easily distinguished from each other.

As illustrated in FIGS. 12A and 12B, all of the first movable electrodes 59, the first fixed electrodes 57, the second movable electrodes 60, and the second fixed electrodes 58 have the same height (thickness). As illustrated in FIGS. 12A and 12B, in the initial state, the top surfaces of the first movable electrodes 59 and the top surfaces of the second fixed electrodes 58 are at the same height. In addition, the top surfaces of the second movable electrodes 60 and the top surfaces of the first fixed electrodes 57 are at the same height, but are downwardly shifted with respect to the first movable electrodes 59 and the second fixed electrodes 58.

A case in which the movable electrodes 59 and 60 are moved downward, as illustrated in FIG. 12A, will be described. In this case, in the first detection portion 61, the opposing areas in which the first movable electrodes 59 are opposed to the first fixed electrodes 57 increases, and the capacitance increases accordingly. In contrast, in the second detection portion 62, the opposing areas in which the second movable electrodes 60 are opposed to the second fixed electrodes 58 decreases, and the capacitance decreases accordingly.

Next, a case in which the movable electrodes 59 and 60 are moved upward, as illustrated in FIG. 12B, will be described. In this case, in the first detection portion 61, the opposing areas in which the first movable electrodes 59 are opposed to the first fixed electrodes 57 decreases, and the capacitance decreases accordingly. In contrast, in the second detection portion 62, the opposing areas in which the second movable electrodes 60 are opposed to the second fixed electrodes 58 increases, and the capacitance increases accordingly.

The potentials of the fixed electrodes 57 and 58 and the potentials of the movable electrodes 59 and 60 are extracted through wiring layers 70, 71, and 72 (see FIG. 1A, which extend from the positions at which the electrodes are connected to the first anchor portion 21, the third anchor portion 22, and the fourth anchor portion 24. Thus, a differential output of the capacitance between the first detection portion 61 and the second detection portion 62 can be obtained. The distance and direction of the movement of the movable portion 6 can be determined on the basis of the differential output.

The comb-like electrode structure illustrated in FIGS. 12A and 12B is merely an example, and the electrodes may instead be formed in other structures.

As illustrated in FIG. 1A, the wiring layer 70 extends to the outside of the element section 13 through the slit 40 between the two arm portions 25 and 26 that extend from the first anchor portion 21. In the present embodiment, as illustrated in FIG. 3, the wiring layer 70 is formed on the oxide insulating layer 4 and extends from the connecting position between the first anchor portion 21 and the wiring layer 70.

In addition, as illustrated in FIG. 1A, the wiring layer 71 extends to the outside of the element section 13 through the slit 54 between the two arm portions 50 and 51 that extend from the third anchor portion 22 and the slit 44 formed in the movable portion 6. Similar to the wiring layer 70, the wiring layer 71 is also formed on the oxide insulating layer 4 and extends from the connecting position between the third anchor portion 22 and the wiring layer 71.

In addition, as illustrated in FIG. 1A, the wiring layer 72 extends to the outside of the element section 13 through the slit 55 between the two arm portions 52 and 53 that extend from the fourth anchor portion 24 and the slit 43 formed in the movable portion 6. Similar to the wiring layer 70, the wiring layer 72 is also formed on the oxide insulating layer 4 and extends from the connecting position between the anchor portion and the wiring layer 72.

The characteristic structure of the present embodiment will now be described.

As illustrated in FIG. 1A, the movable portion 6 is connected to the first and second anchor portions 21 and 23 by the support portions 8 to 11 which include the arm portions 25 to 28, the anchor-side spring portions 29, the beam portions 30 to 33, and the movable-portion-side spring portions 34.

As illustrated in FIG. 2, the width W3 of the beam portions 30 to 33 is larger than that of the spring portions 29 and 34, and the rigidity of the beam portions 30 to 33 is higher than that of the spring portions 29 and 34.

When an acceleration is applied in the height direction to the movable portion 6 that is in the initial state illustrated in FIG. 1B, the movable portion 6 moves, for example, downward as illustrated in FIG. 1C. In such a case, all of the anchor-side spring portions 29 and the movable-portion-side spring portions 34 are twisted. Accordingly, the distal ends 30a to 33a of the respective beam portions 30 to 33 are pivoted downward, and the movable portion 6 translates downward.

In the present embodiment, torsion springs and the beam portions 30 to 33 having a high rigidity are used, and the movable portion 6 is translated in the height direction (Z direction) by moving the distal ends 30a to 33a of the beam portions 30 to 33, at which the beam portions 30 to 33 are connected to the movable portion 6, in the height direction. Accordingly, the movable portion 6 can be moved by a large amount in the height direction. The movable portion 6 can be moved by a large amount even when the size of the movable portion 6 is reduced. Therefore, the overall size of the acceleration sensor 1 can be reduced.

In the embodiment illustrated in FIG. 1A, the movable portion 6 is supported by the support portions 8 to 11 at positions near the four corners thereof. The number of support portions 8 to 11 and the positions at which the movable portion 6 is supported by the support portions 8 to 11 are not limited. However, the movable portion 6 is preferably supported by the support portions 8 to 11 at least at point symmetrical positions about the center O of the movable portion 6. In such a case, the vertical movement of the movable portion 6 can be stabilized. In addition, two pairs of support portions 8 to 11 that are point-symmetrical to each other, that is, four support portions 8 to 11 in total, are preferably arranged to support the movable portion 6, as illustrated in FIG. 1A. In such a case, the translation of the movable portion 6 in the height direction can be further stabilized.

In the embodiment illustrated in FIG. 1A, the first and second anchor portions 21 and 23 are positioned inside the area C defined by the outermost periphery of the movable portion 6. Thus, the anchor portions 21 and 23, which are fixed to and supported by the support substrate 3 with the oxide insulating layer 4 interposed therebetween, are positioned inside the area C defined by the outermost periphery of the movable portion 6. Therefore, even when, for example, the support substrate 3 is deformed by the influence of a stress, the influence of the deformation that is transmitted to each portion of the element from the anchor portions 21 to 24 can be reduced. In particular, a change in the relative position between the movable and fixed electrodes caused by the deformation can be reduced. The anchor portions 21 and 23 are positioned inside the area C of the movable portion 6, and the beam portions 30 to 33, which are connected to the anchor portions 21 and 23 by the anchor-side spring portions 29, are disposed outside the outermost periphery of the movable portion 6. Therefore, the movable portion 6 can be easily supported by the support portions 8 to 11 at the positions near the four corners. Accordingly, the acceleration sensor 1, which is small and has a high sensitivity, can be more effectively provided.

The shape of the area C defined by the outermost periphery of the movable portion 6 is not limited to the rectangular shape illustrated in FIG. 1A. For example, the area C may have a circular shape. However, when the area C defined by the outermost periphery of the movable portion 6 has a rectangular shape and the beam portions 30 to 33 are arranged along the outermost periphery of the movable portion 6 as illustrated in FIG. 1A, the size of the movable portion 6 can be increased without increasing the overall size of the acceleration sensor 1. In addition, the support portions 8 to 11 can be positioned with a good balance with respect to the movable portion 6, and the stability of translation of the movable portion 6 in the height direction can be ensured.

As illustrated in FIG. 1A, two support portions are provided on each of the first and second anchor portions 21 and 23. The first beam portion 30, which is connected to the first anchor portion 21 by the anchor-side spring portions 29, extends in the Y1 direction at a position outside the movable portion 6. The second beam portion 31 extends in the Y2 direction at a position outside the movable portion 6. The proximal ends 30b and 31b of the beam portions 30 and 31, respectively, are opposed to each other with a predetermined interval therebetween (see also FIG. 1B). The support portions 10 and 11 provided on the second anchor portion 23 have a structure similar to the above-described structure.

Figure 7:
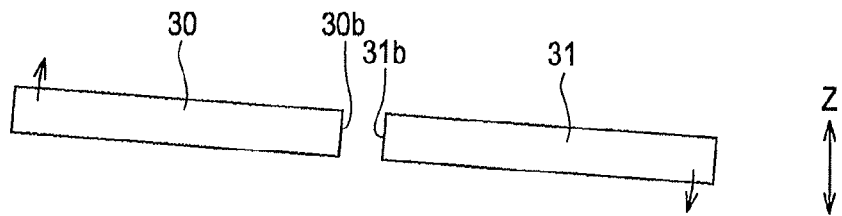
FIG. 7 is a side view illustrating a first beam portion 30 and a second beam portion 31 for explaining an abnormal movement mode (rotation mode)

It has been found that the natural frequency of a normal movement mode in which the distal ends 30a to 33a of the respective beam portions 30 to 33 are moved in the same height direction (Z direction), as illustrated in FIG. 1C, is close to the natural frequency of an abnormal movement mode (rotation mode) in which the distal ends 30a to 33a of the respective beam portions 30 to 33 rotate about a center axis positioned near the proximal ends 30b to 33b of the respective beam portions 30 to 33, as illustrated in FIG. 7. The natural frequency of the normal movement mode is, for example, 2.8 kHz and the natural frequency of the abnormal movement mode is, for example, 3.0 kHz.

Figure 8:
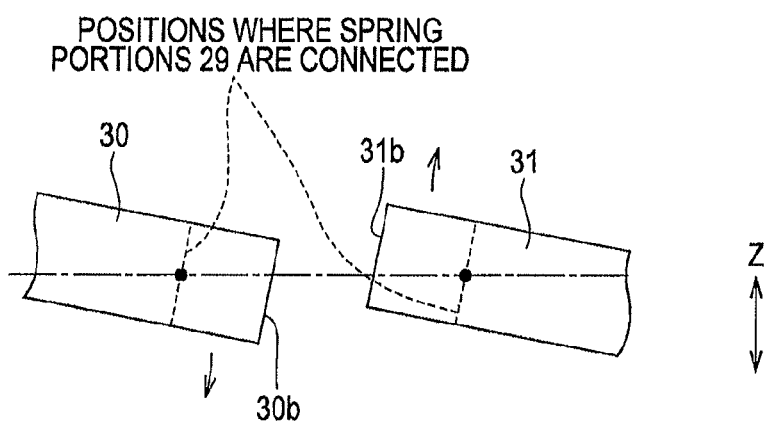
FIG. 8 is an enlarged view of FIG. 7.

In has also been found that, in the abnormal movement mode illustrated in FIG. 7, the proximal end 30b of the first beam portion 30 and the proximal end 31b of the second beam portion 31 are moved in the opposite height directions (Z directions), as illustrated in FIG. 8.

Figure 4A:
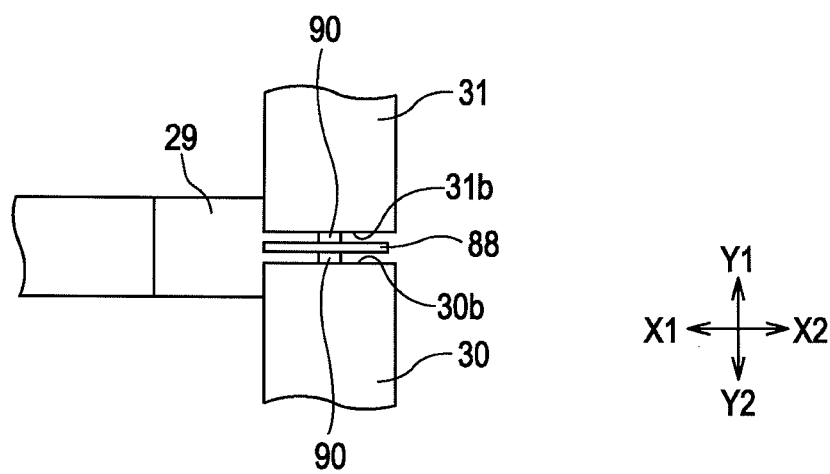
FIG. 4A is a partial plan views of a preferred embodiment.
Figure 5:
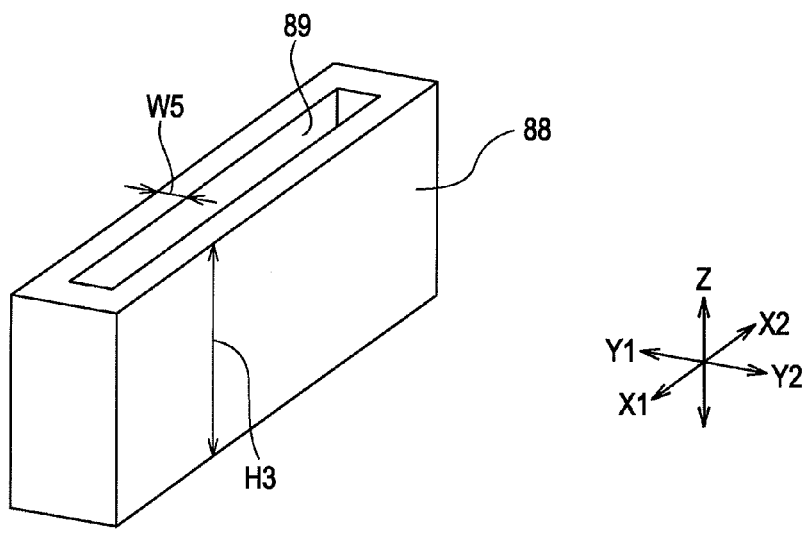
FIG. 5 shows an example of a connection spring (perspective view)

Accordingly, as illustrated in FIG. 4A, the proximal end 30b of the first beam portion 30 and the proximal end 31b of the second beam portion 31 are connected to each other with a connection spring 88 having a high flexural rigidity in the height direction (Z direction). In such a case, the natural frequency of the abnormal movement mode can be increased (by about 10 kHz to 20 kHz), and the difference between the natural frequency of the abnormal movement mode and that of the normal movement mode can be increased accordingly. As a result, the movement in the abnormal movement mode illustrated in FIG. 7 can be suppressed and the movement in the normal movement mode illustrated in FIG. 1C can be reliably generated. Thus, the movable portion 6 can be more reliably translated in the height direction (Z direction). The connection spring 88 illustrated in FIG. 4A has a rectangular parallelepiped shape in an external view, and has a space 89 that vertically extends through the connection spring 88 at the center thereof, as illustrated in FIG. 5. The height H3 of the connection spring 88 is larger than the width W5. The width W5 is substantially equal to the width of the anchor-side spring portions 29 and the movable-portion-side spring portions 34, and the height H3 is substantially equal to the height of the anchor-side spring portions 29, the movable-portion-side spring portions 34, and the beam portions.

As illustrated in FIG. 4A, connecting members 90 having a rigidity higher than that of the connection spring 88 are provided between the first beam portion 30 and the connection spring 88 and between the second beam portion 31 and the connection spring 88. The height of the connecting members 90 is substantially equal to the height of the connection spring 88 and the beam portions.

Figure 4B:
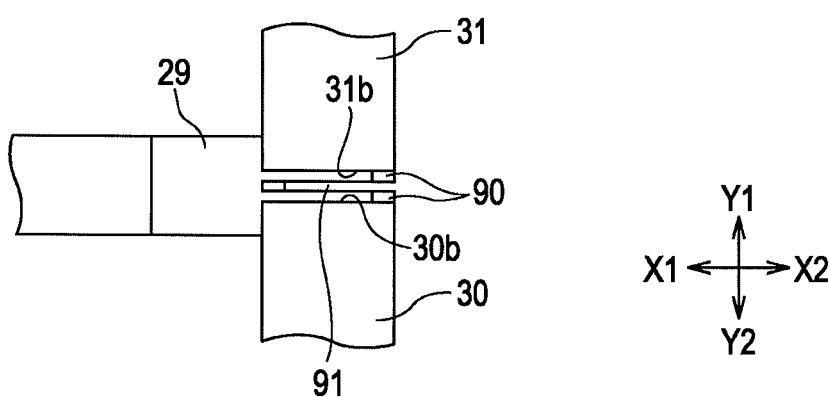
FIG. 4B is a partial plan views of a preferred embodiment.
Figure 6:
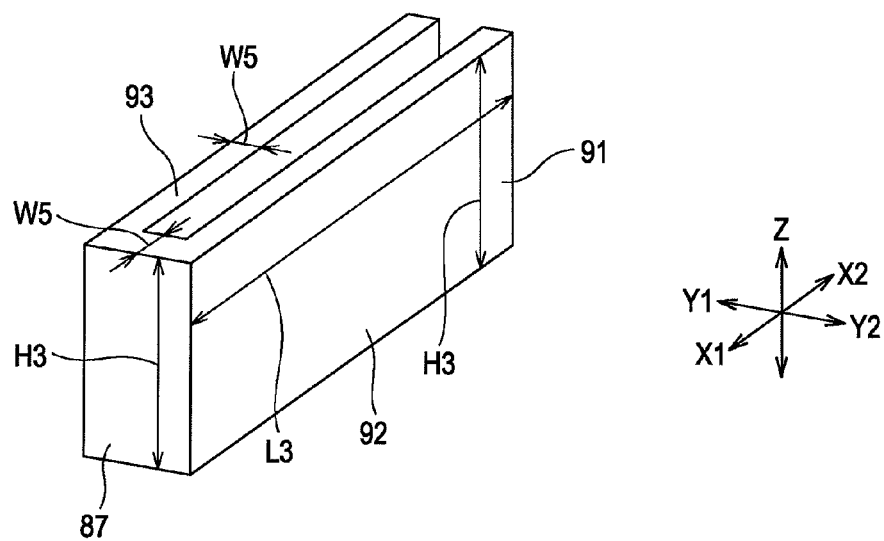
FIG. 6 is a perspective view of a connection spring having a structure different from that illustrated in FIG. 5.

In FIG. 4B, the proximal ends 30b and 31b of the first and second beam portions 30 and 31 are connected to each other and supported by a connection spring 91 illustrated in FIG. 6. The connection spring 91 illustrated in FIG. 6 includes two wall portions 92 and 93 and a connecting portion 87 that connects the wall portions 92 and 93 to each other at one end thereof. The width, height, and length of each of the wall portions 92 and 93 are W5, H3, and L3, respectively. The width and height of the connecting portion 87 are W5 and H3, respectively. As illustrated in FIG. 4B, the connection spring 91 is connected to the proximal ends 30b and 31b of the beam portions 30 and 31 by the connecting members 90 at the ends of the wall portions 92 and 93 that are free from the connecting portion 87. The connecting members 90 are similar to those illustrated in FIG. 4A, and have a rigidity higher than that of the connection spring 91.

Similar to the structures illustrated in FIGS. 4A and 4B, the proximal ends 32b and 33b of the third and fourth beam portions 32 and 33, which are connected to the second anchor portion 23, are also connected to each other by the connection spring 88 or 91 having a high flexural rigidity in the height direction (Z direction).

In the structures illustrated in FIGS. 1A and 4, the two beam portions 30 and 31 (or 32 and 33) that are connected to each anchor portion by the anchor-side spring portions 29 extend in the opposite directions (in the Y1 direction and the Y2 directions). However, the present embodiment may also be applied to other structures. In addition, instead of placing the connection springs 88 or 91 between the proximal ends 30b to 33b of the beam portions 30 to 33, connection springs may be provided on the side surfaces of the beam portions 30 to 33 at the proximal ends 30b to 33b.

Figure 9:
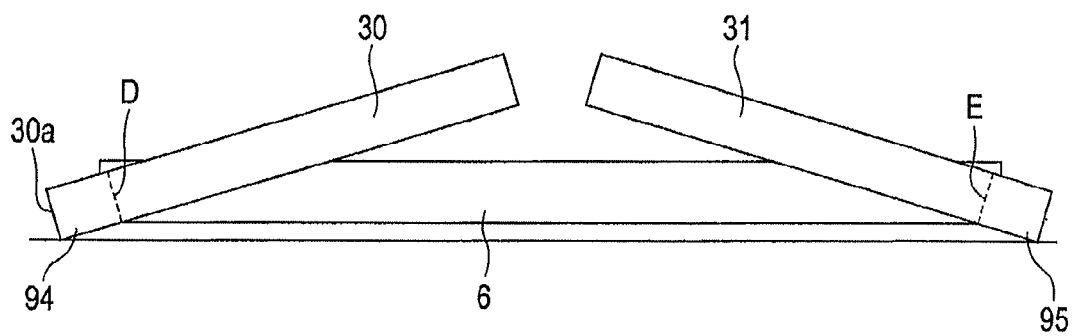
FIG. 9 is a partial side view according to a preferred embodiment.
Figure 10:
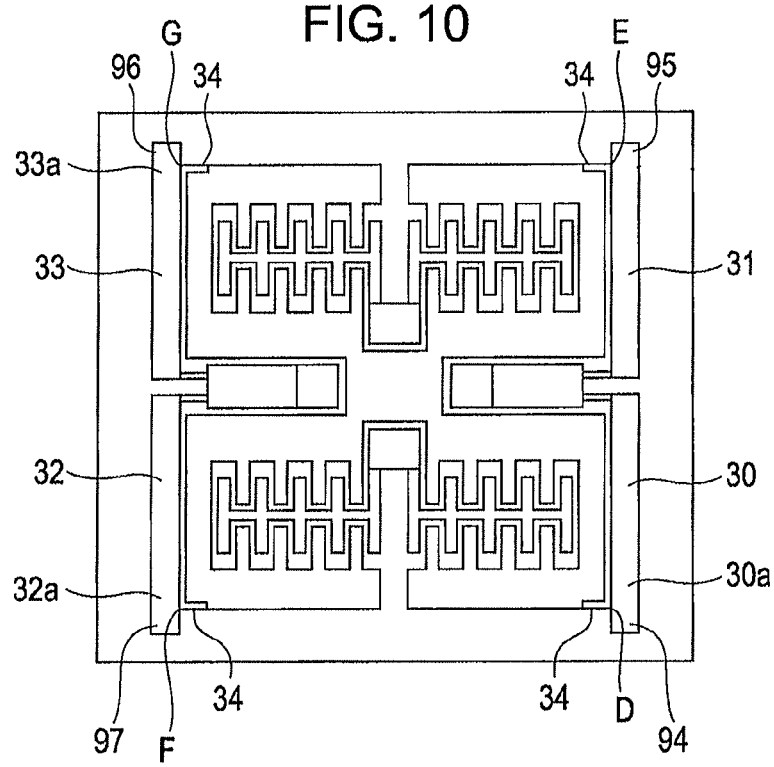
FIG. 10 is a plan view of an acceleration sensor according to an embodiment which is provided with a sticking prevention structure.

As illustrated in FIGS. 9 and 10, extending portions 94 to 97 that extend from support positions D to G at which the movable portion 6 is supported by the movable-portion-side spring portions 34 are preferably provided at the distal ends 30a to 33a of the respective beam portions 30 to 33. In such a case, when the acceleration is applied in the height direction and the movable portion 6 is translated downward, the extending portions 94 to 97 come into contact with the support substrate 3 before the movable portion 6 does, as illustrated in FIG. 9. Therefore, the movable portion 6 can be prevented from sticking onto the surface of the support substrate 3.

Figure 11:
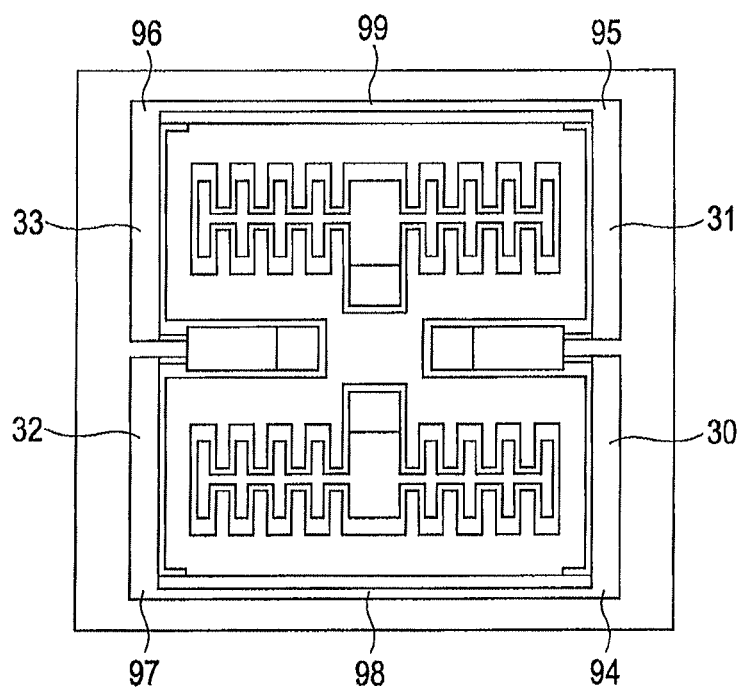
FIG. 11 is a plan view of an acceleration sensor according to an embodiment that has a structure different from that illustrated in FIG. 10.

As illustrated in FIG. 11, the extending portion 94 of the first beam portion 30 and the extending portion 97 of the third beam portion 32 can be connected to each other with a connecting beam 98, and the extending portion 95 of the second beam portion 31 and the extending portion 96 of the fourth beam portion 33 can be connected to each other with a connecting beam 99. However, in the structure illustrated in FIG. 11, the wiring layers 71 and 72 illustrated in FIG. 1A that extend to the outside from the positions at which the wiring layers 71 and 72 are connected to the third and fourth anchor portions 22 and 24, respectively, cannot be formed on the surface of the element (because the connection beams 98 and 99 extend over the areas in which the wiring layers 71 and 72 are to be formed). Therefore, a multilayer wiring structure or a penetration wiring structure must be provided.

Figure 13:
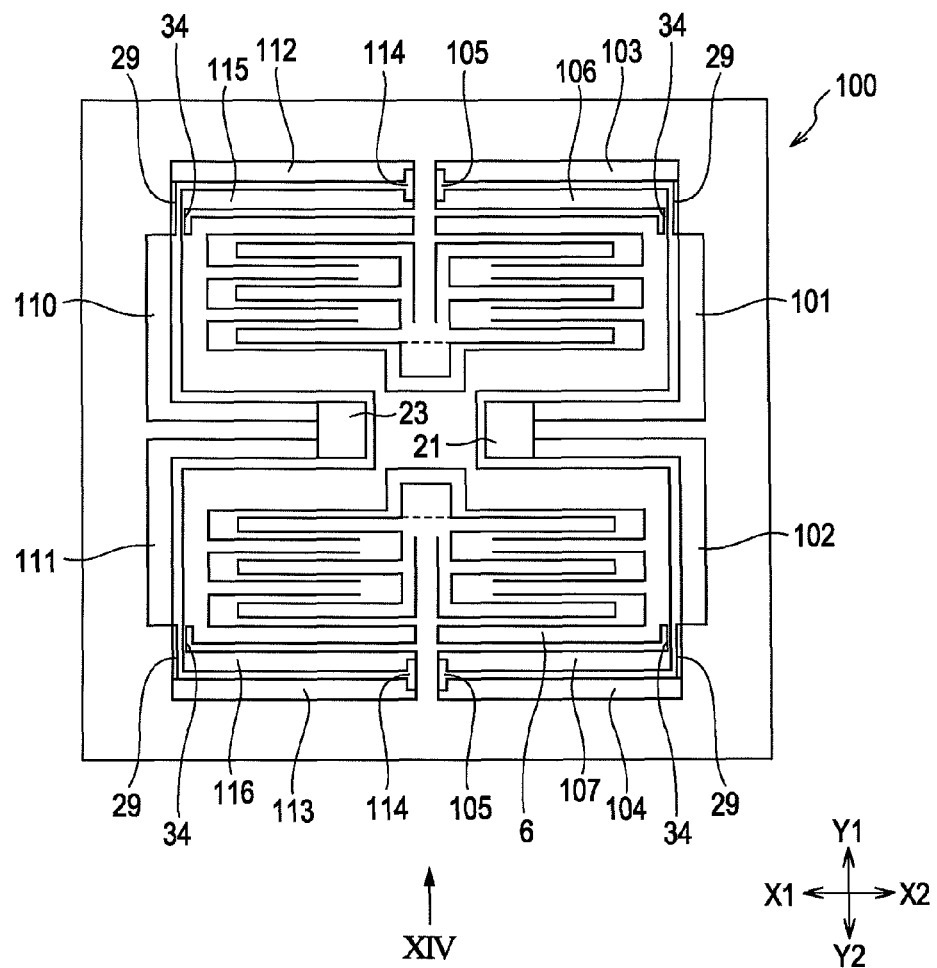
FIG. 13 is a plan view of an acceleration sensor according to another embodiment.
Figure 14:
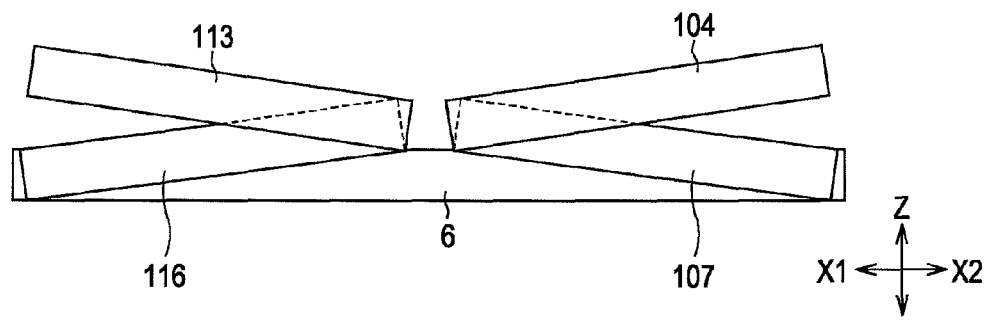
FIG. 14 is a side view of the acceleration sensor illustrated in FIG. 13 viewed in the direction shown by the arrow XIV.

FIG. 13 is a plan view of an acceleration sensor 100 according to another embodiment. FIG. 14 is a side view of the acceleration sensor 100 illustrated in FIG. 13 viewed in the direction shown by the arrow XIV.

In the structure illustrated in FIG. 13, two arm portions 101 and 102 extend from a first anchor portion 21 in a substantially L-shape along the outer periphery of a movable portion 6. Outer beam portions 103 and 104 are connected to the arm portions 101 and 102, respectively, with anchor-side spring portions 29. Inner beam portions 106 and 107, which are positioned inside the outer beam portions 103 and 104, are connected to the outer beam portions 103 and 104, respectively, with intermediate spring portions 105. The movable portion 6 is supported by the inner beam portions 106 and 107 with movable-portion-side spring portions 34 interposed therebetween. Similarly, support portions that extend from a second anchor portion 23 are formed by substantially L-shaped arm portions 110 and 111, anchor-side spring portions 29, outer beam portions 112 and 113, intermediate spring portions 114, inner beam portions 115 and 116, and movable-portion-side spring portions 34.

When an acceleration is applied in the height direction (Z direction) and the movable portion 6 is moved, for example, downward, the anchor-side spring portions 29, the intermediate spring portions 105 and 114, and the movable-portion-side spring portions 34 are twisted such that the outer beam portions 103, 104, 112, and 113 and the inner beam portions 106, 107, 115, and 116 are moved in the height direction (Z direction), as illustrated in FIG. 14. Accordingly, the movable portion 6 is translated downward. In the structure illustrated in FIGS. 13 and 14, the displacement of the movable portion 6 in the height direction can be effectively increased. Therefore, the size can be reduced and the detection accuracy can be increased.

In the embodiment illustrated in FIG. 1A, the detection portions have the comb-like electrode structure. However, the detection portions may have a parallel-plate electrode structure, as illustrated in FIGS. 15, 16, and 17 instead of the comb-like electrode structure.

Figure 15:
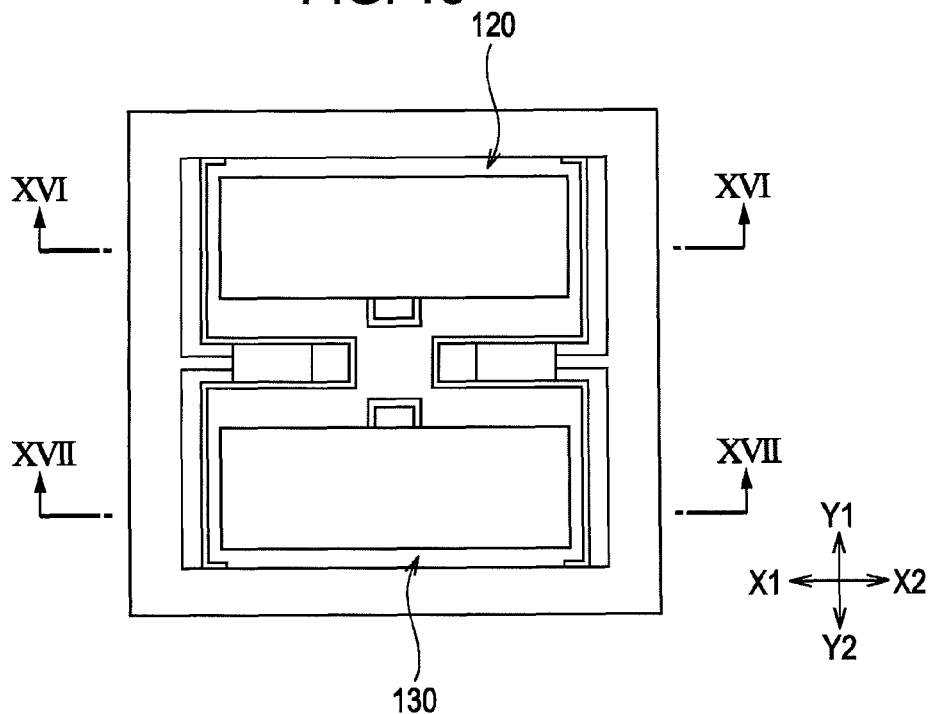
FIG. 15 is a plan view of an acceleration sensor including a parallel-plate electrode structure.
Figure 16:
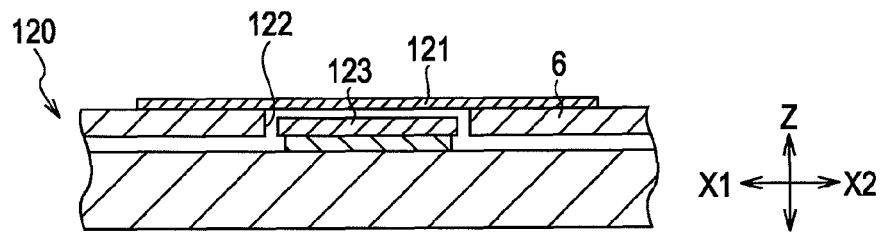
FIG. 16 is a partial enlarged sectional view of FIG. 15 taken along line XVI-XVI in the film thickness direction and viewed in the direction shown by the arrows.
Figure 17:
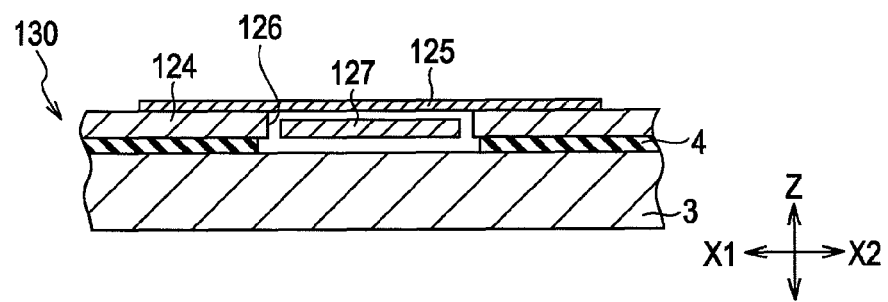
FIG. 17 is a partial enlarged sectional view of FIG. 15 taken along line XVII-XVII in the film thickness direction and viewed in the direction shown by the arrows.

Referring to FIG. 15 and FIG. 16 (partial enlarged sectional view of FIG. 15 taken along line XVI-XVI in the film thickness direction and viewed in the direction shown by the arrows), in a first detection portion 120, a counter electrode 121 is formed on the top surface of the movable portion 6. The counter electrode 121 is opposed to a fixed electrode 123 in the height direction (Z direction). The fixed electrode 123 is disposed in a space 122 formed in the movable portion 6. In addition, referring to FIG. 15 and FIG. 17 (partial enlarged sectional view of FIG. 15 taken along line XVII-XVII in the film thickness direction and viewed in the direction shown by the arrows), in a second detection portion 130, a counter electrode 125 is formed on the top surface of a fixed portion 124 that is fixed to and supported by a support substrate 3 with an oxide insulating layer 4 interposed therebetween. The counter electrode 125 is opposed to a movable electrode 127 in the height direction (Z direction). The movable electrode 127 is disposed in a space 126 formed in the fixed portion 124 and is formed integrally with the movable portion 6. When, for example, the movable portion 6 (and the movable electrode 127) is translated downward, the distance between the counter electrode 121 and the fixed electrode 123 decreases in the first detection portion 120 illustrated in FIG. 16. In contrast, the distance between the movable electrode 127 and the counter electrode 125 increases in the second detection portion 130 illustrated in FIG. 17. Therefore, the distance and direction of the movement of the movable portion 6 can be determined on the basis of the differential output based on the capacitance variation in the first detection portion 120 and the capacitance variation in the second detection portion 130. In the present embodiment, the displacement of the movable portion 6 in the height direction (Z direction) can be effectively increased. Therefore, when the detection mechanism including the parallel-plate electrodes illustrated in FIGS. 15 to 17 is used, the detection accuracy can be further increased.

A method for manufacturing the parallel-plate electrodes illustrated in FIGS. 16 and 17 will be described with reference to FIGS. 18A to 23B. FIGS. 18A, 19A, 20A, 21A, 22A, and 23A illustrate the processes of forming the first detection portion 120, and FIGS. 18B, 19B, 20B, 21B, 22B, and 23B illustrate the processes of forming the second detection portion 130.

Figure 18A:
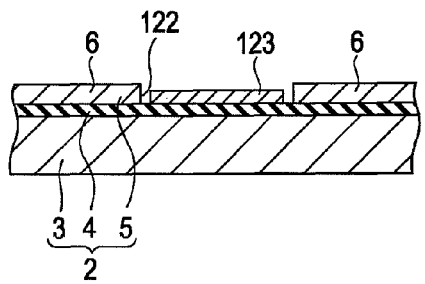
FIGS. 18A and 18B are diagrams (sectional views) illustrating a process of a method for manufacturing the acceleration sensor illustrated in FIGS. 16 and 17.
Figure 18B:
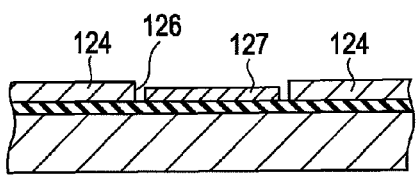

In the process illustrated in FIGS. 18A and 18B, an SOI substrate 2 including the support substrate 3, the oxide insulating layer 4, and an SOI layer (active layer) 5 is prepared, and the SOI layer 5 is etched so as to define the sections for the movable portion 6, the fixed electrodes 123 and 124, and the movable electrode 127. In this process, the spaces 122 and 126 illustrated in FIGS. 16 and 17 in which the counter electrodes 121 and 125 are to be disposed are formed.

Figure 19A:
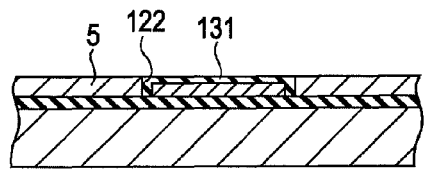
FIGS. 19A and 19B show diagrams (sectional views) illustrating a process performed after the process illustrated in FIGS. 18A and 18B.
Figure 19B:
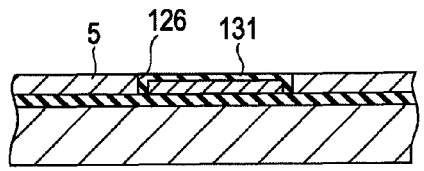

Then, in the process illustrated in FIGS. 19A and 19B, the spaces 122 and 126 are filled with a second oxide insulating layer (SiO2 layer) 131 by sputtering or the like. Then, the surfaces of the second oxide insulating layer 131 and the SOI layer 5 are planarized by chemical mechanical polishing (CMP) or the like.

Figure 20A:
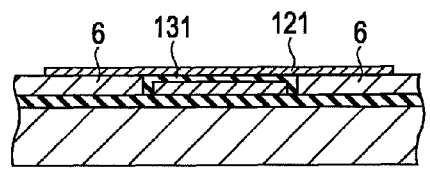
FIGS. 20A and 20B show diagrams (sectional views) illustrating a process performed after the process illustrated in FIGS. 19A and 19B.
Figure 20B:
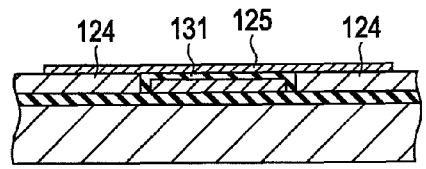
Figure 21A:
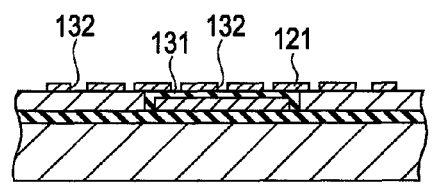
FIGS. 21A and 21B show diagrams (sectional views) illustrating a process performed after the process illustrated in FIGS. 20A and 20B.
Figure 21B:
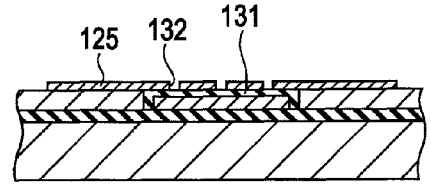
Figure 22A:
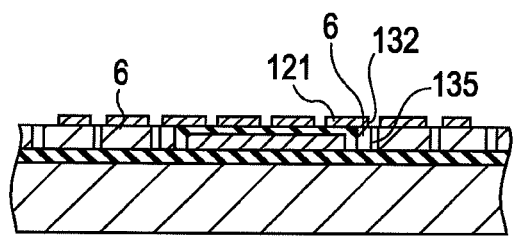
FIGS. 22A and 22B show diagrams (sectional views) illustrating a process performed after the process illustrated in FIGS. 21A and 21B.
Figure 22B:
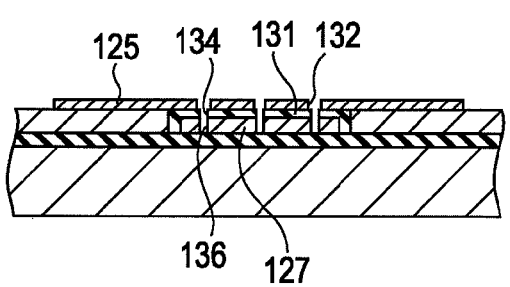
Figure 23A:
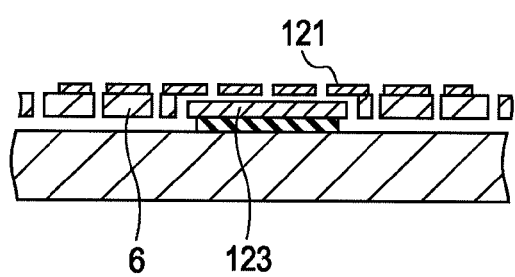
FIGS. 23A and 23B show diagrams (sectional views) illustrating a process performed after the process illustrated in FIGS. 22A and 22B.
Figure 23B:
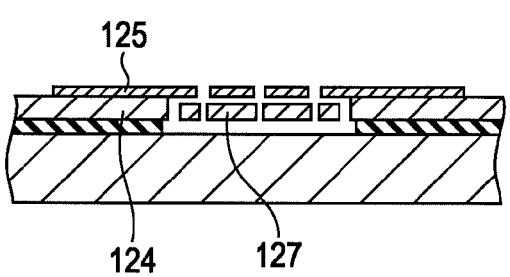

Then, in the process illustrated in FIGS. 20A and 20B, the counter electrodes 121 and 125 are formed. Then, in the process illustrated in FIGS. 21A and 21B, multiple micropores 132 are formed in the counter electrodes 121 and 125. In FIG. 21A, the micropores 132 are formed in the counter electrode 121 over substantially the entire area thereof. In FIG. 21B, the micropores 132 are formed in the counter electrode 121 only in an area where the counter electrode 121 is opposed to the movable electrode 127. Next, micropores 134 are formed in the second oxide insulating layer 131 at positions where the second oxide insulating layer 131 is exposed at the micropores 132 formed in the process illustrated in FIG. 21B (see FIG. 22B). In FIG. 22A, micropores 135 that communicate with the micropores 132 formed in the counter electrode 121 are formed in the movable portion 6. In FIG. 22B, micropores 136 that communicate with the micropores 132 and 134 formed in the counter electrode 125 and the second oxide insulating layer 131 are formed in the movable electrode 127. In the process illustrated in FIGS. 23A and 23B, portions of the oxide insulating layer 4 and the second oxide insulating layer 131 at the lower side of the movable portion 6, at the upper side of the fixed electrode 123, and at the upper and lower sides of the movable electrode 127 are removed by isotropic etching, such as wet etching or dry etching, through the micropores 132 to 136.

Figure 24:
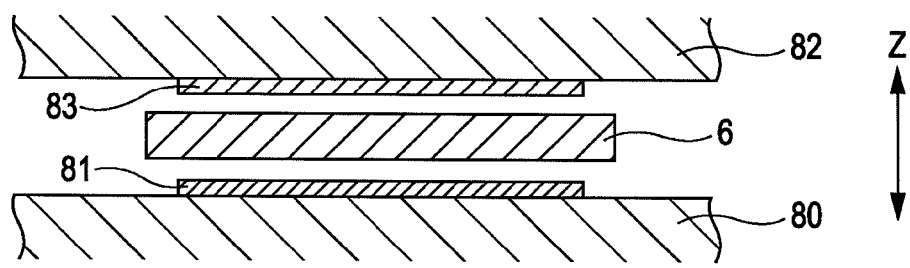
FIG. 24 is a sectional view illustrating another detection electrode structure.
Figure 25A:
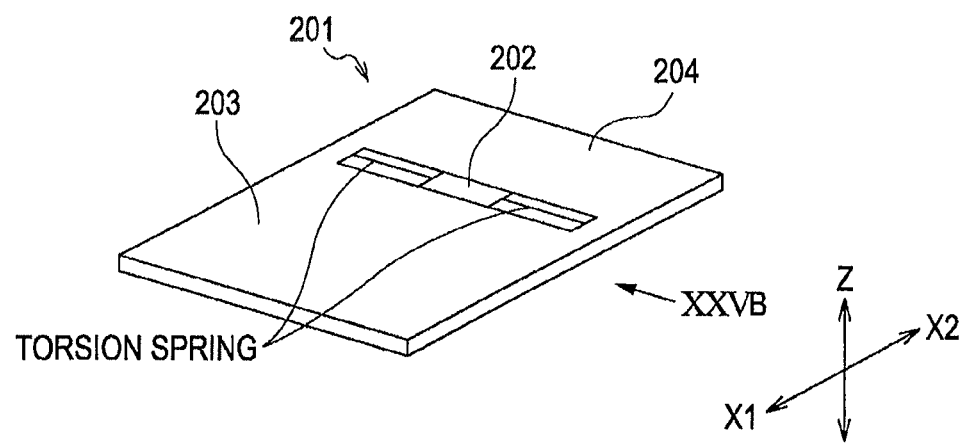
FIG. 25A is a partial perspective view of an acceleration sensor having a conventional structure.
Figure 25B:
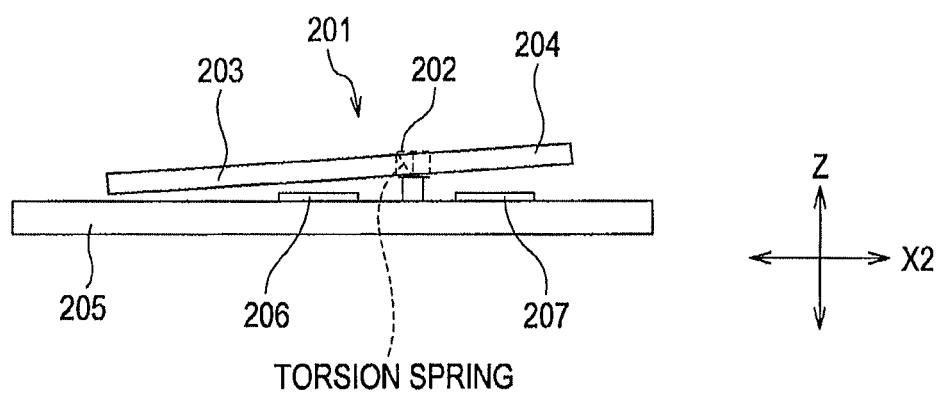
FIG. 25B is a partial side view of the acceleration sensor illustrated in FIG. 25A viewed in the direction shown by the arrow XXVB.

FIG. 24 illustrates another embodiment in which a first fixed electrode 81 is opposed to a movable portion 6 at the lower side thereof and a second fixed electrode 83 is opposed to the movable portion 6 at the upper side thereof. The first fixed electrode 81 is provided on a top surface of a lower support substrate 80. As illustrated in FIG. 24, a predetermined gap is provided between the first fixed electrode 81 and the movable portion 6. The second fixed electrode 83 is provided on a bottom surface of an upper support substrate 82. As illustrated in FIG. 24, a predetermined gap is provided between the second fixed electrode 83 and the movable portion 6.

In the present embodiment, the movable portion 6 translates upward and downward along the Z axis. When the movable portion 6 translates upward or downward, the capacitance between the movable portion 6 and the first fixed electrode 81 and the capacitance between the movable portion 6 and the second fixed electrode 83 vary. Therefore, the distance and direction of the movement of the movable portion 6 can be determined on the basis of the differential output based on the capacitance variations.

The structure illustrated in FIG. 24 can be obtained by stacking the lower support substrate 80 provided the first fixed electrode 81, a silicon substrate on which the movable portion 6 and other elements are formed, and the upper support substrate 82 provided with the second fixed electrode 83 in that order from the bottom. The spaces between the first fixed electrode 81 and the movable portion 6 and between the second fixed electrode 83 and the movable portion 6 can be formed by forming a sacrificial layer (oxide insulating layer) and then removing the sacrificial layer, as in the SOI substrate. The structure for supporting the movable portion 6 is similar to that illustrated in FIGS. 1A to 1C and other figures. More specifically, the movable portion 6 is supported by support portions that are connected to the anchor portions, which are formed on the support substrate and are thicker than the movable portion 6, in such a manner that the movable portion 6 is movable in the height directions.

In the structure illustrated in FIG. 24, the fixed electrodes 81 and 83 are disposed above and below the movable portion 6, and the movable range of the movable portion 6 in the vertical directions can be relatively freely set. Therefore, the detection accuracy can be increased.

Preferably, as illustrated in FIG. 24, the dimensions of the fixed electrodes 81 and 82 are set such that the entire bodies of the fixed electrodes 81 and 82 are opposed to the outermost periphery of the movable portion 6 (that is, such that the fixed electrodes 81 and 82 do not partially protrude from the movable portion 6). In such a case, the variation in the capacitance between the first fixed electrode 81 and the movable portion 6 and the variation in the capacitance between the second fixed electrode 83 and the movable portion 6 can be accurately detected.

The acceleration sensor according to the present embodiment is of a one-axis type which detects the acceleration along the Z axis. However, two-axis or three-axis type acceleration sensors may also be obtained by additionally providing sensor units for detecting accelerations along the X-axis and Y-axis.

The present embodiment may be applied not only to an acceleration sensor but also to an angular-velocity sensor and the like.

What is claimed is:

1. A physical quantity sensor comprising:
a support substrate;
an anchor portion fixed to a top surface of the support substrate;
a movable portion positioned above the support substrate and supported by the anchor portion with a plurality of support portions provided therebetween such that the movable portion is movable in a height direction; and
a detection portion for detecting a displacement of the movable portion,
wherein each support portion includes a beam portion provided between the movable portion and the anchor portion such that a spring portion is provided between the beam portion and each of the movable portion and the anchor portion, the beam portion having a rigidity higher than a rigidity of the spring portion,
wherein the movable portion translates in the height direction owing to twisting of the spring portion and a displacement in the height direction of a distal end of the beam portion, the movable portion being supported at the distal end,
wherein the support portions are provided so as to extend from the anchor portion and the beam portions of the respective support portions are connected to each other with a connection spring at proximal ends of the beam portions opposite to the distal ends, the connection spring having a high flexural rigidity in the height direction, and
wherein the anchor portion is positioned inside an area defined by the outermost periphery of the movable portion, and the beam portion is positioned outside the outermost periphery of the movable portion, the beam portion being connected to the anchor portion with the spring portion provided between the beam portion and the anchor portion.

2. The physical quantity sensor according to claim 1, wherein the movable portion is supported by the support portions at point symmetrical positions about the center of the movable portion.

3. The physical quantity sensor according to claim 2, wherein the movable portion is supported by the support portions at two or more different pairs of point symmetrical positions.

4. The physical quantity sensor according to claim 1, wherein one pair of the anchor portions are provided at point symmetrical positions about the center of the movable portion, and two of the support portions are provided for each anchor portion and extend in the opposite directions at positions outside the outermost periphery of the movable portion, the movable portion being supported by the support portions at two different pairs of point symmetrical positions.

5. The physical quantity sensor according to claim 1, wherein the area defined by the outermost periphery of the movable portion is substantially rectangular, and the beam portion is arranged along the outermost periphery.

6. The physical quantity sensor according to claim 1, wherein a plurality of the support portions are provided so as to extend from the anchor portion, and the beam portions of the respective support portions are connected to each other with a connection spring at proximal ends of the beam portions opposite to the distal ends, the connection spring having a high flexural rigidity in the height direction.

7. The physical quantity sensor according to claim 1, wherein the beam portion is provided with an extending portion at the distal end of the beam portion, the extending portion extending from a position where the movable portion is supported by the spring portion and being capable of coming into contact with the top surface of the support substrate before the movable portion does when the movable portion is moved downward.

* * * * *